(12) United States Patent
Yang et al.

(10) Patent No.: US 7,948,035 B2
(45) Date of Patent: May 24, 2011

(54) DECODING SYSTEM CAPABLE OF CHARGING PROTECTION FOR FLASH MEMORY DEVICES

(75) Inventors: Nian Yang, Mountain View, CA (US); Joon-Heong Ong, Penang (MY); Jiani Zhang, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 523 days.

(21) Appl. No.: 12/034,316

(22) Filed: Feb. 20, 2008

(65) Prior Publication Data
US 2009/0206386 A1    Aug. 20, 2009

(51) Int. Cl.
*H01L 23/62*    (2006.01)
*H01L 29/792*    (2006.01)

(52) U.S. Cl. .. 257/356; 257/355; 257/324; 257/E27.103

(58) Field of Classification Search .................. 257/324, 257/355–357, E27.103
See application file for complete search history.

(56) References Cited

U.S. PATENT DOCUMENTS

| 7,713,875 B2 * | 5/2010 | Brennan et al. | 438/682 |
| 7,750,407 B2 * | 7/2010 | Zheng et al. | 257/355 |

* cited by examiner

*Primary Examiner* — Anh Phung
*Assistant Examiner* — Allison P Bernstein
(74) *Attorney, Agent, or Firm* — Eschweiler & Associates, LLC

(57) ABSTRACT

The present invention relates to a flash memory array. The flash memory array includes at least two word lines of gate electrode material. At least one of the word lines is connected through a first metal level to a discharge circuit, while other word line(s) may connect to a discharge circuit through a first and second metal level. The memory array further includes a shorting path between the word lines of the memory array. The shorting path is a high resistance layer of undoped gate electrode material. The resistance value of the gate electrode material is such that the word lines can be used to read, write, or erase without effecting each other, but that during the formation of a first metal level, as charges will build up on a first word line which requires a second metal level to connect to its discharge junction circuit, it will short the first word line to an adjacent second word line that has a connection to its junction circuit on the first metal level.

10 Claims, 18 Drawing Sheets

US 7,948,035 B2

DECODING SYSTEM CAPABLE OF CHARGING PROTECTION FOR FLASH MEMORY DEVICES

FIELD OF INVENTION

The present invention relates generally to the field of integrated chip manufacturing and more particularly to a process for protection of flash memory cells from plasma charge damage during manufacturing.

BACKGROUND OF THE INVENTION

Plasma etching and reactive ion etching (RIE) are important tools in semiconductor fabrication. These etches, which utilize excited ions as etchants, offer a high degree of anisotropy compared to wet etchants. Because of this, they are widely used in many integrated chip fabrication processes. For example, in the back end of the line processing, RIE etching is often used to provide a large sidewall angle for metal and via levels.

The ions which are used in these plasma based etches can induce a charge on exposed conductive levels (e.g., polysilicon gates, aluminum metal levels). During the course of the etching process, this induced charge can build up leading to processing and reliability problems. For example, the buildup of charge on a polysilicon gate can cause charge dissipation through the underlying gate oxide, which, depending on the amount of charge buildup and the oxide thickness, may lead to either device degradation or complete gate dielectric breakdown and device failure.

It is common in the semiconductor fabrication industry to include protection circuitry associated with devices. The protection circuitry allows plasma charge buildup to be dissipated from a conductive layer before it causes damage. For example, capacitors are often attached to a polysilicon layer and used for the purpose of dissipating built up charge. Unfortunately, the use of these devices requires relatively large silicon area. Alternative methods of charge dissipation may require metal wiring to connect conductive layers to discharge junctions. The metal wiring utilized in these methods is increasingly difficult to design as scaling often fails to allow a geometric shrink of metal levels. As technologies continue to shrink and silicon area becomes more valuable it is increasingly important to find alternative methods of charge dissipation which are unrestrictive to the functional circuitry.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a flash memory array with increased plasma charge damage protection. The flash memory array comprises at least two word lines of gate electrode material. At least one of the word lines is connected through a first metal level to a discharge circuit. At least one of the other word lines is connected to a discharge junction circuit through a first and second metal level. The memory array further comprises a shorting path between the at least two word lines of the memory array. The shorting path is a high resistance layer of undoped gate electrode material. The resistance is high enough that the word lines can be used to read, write, or erase without affecting each other. However, the resistance is low enough that during the formation of a first metal level, as charges build up on a first word line requiring a second metal level to connect to its discharge junction circuit, the shorting path will short the first word line to another word line that has a connection to its discharge junction circuit on only the first metal level.

An additional embodiment of the present invention further comprises a semiconductor diode electrically coupled to the shorting path and the at least two word lines, by way of a first metal, a first contact, and a second contact. The semiconductor diode acts as a safety value for charge amassing on the word lines. Other embodiments are also disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
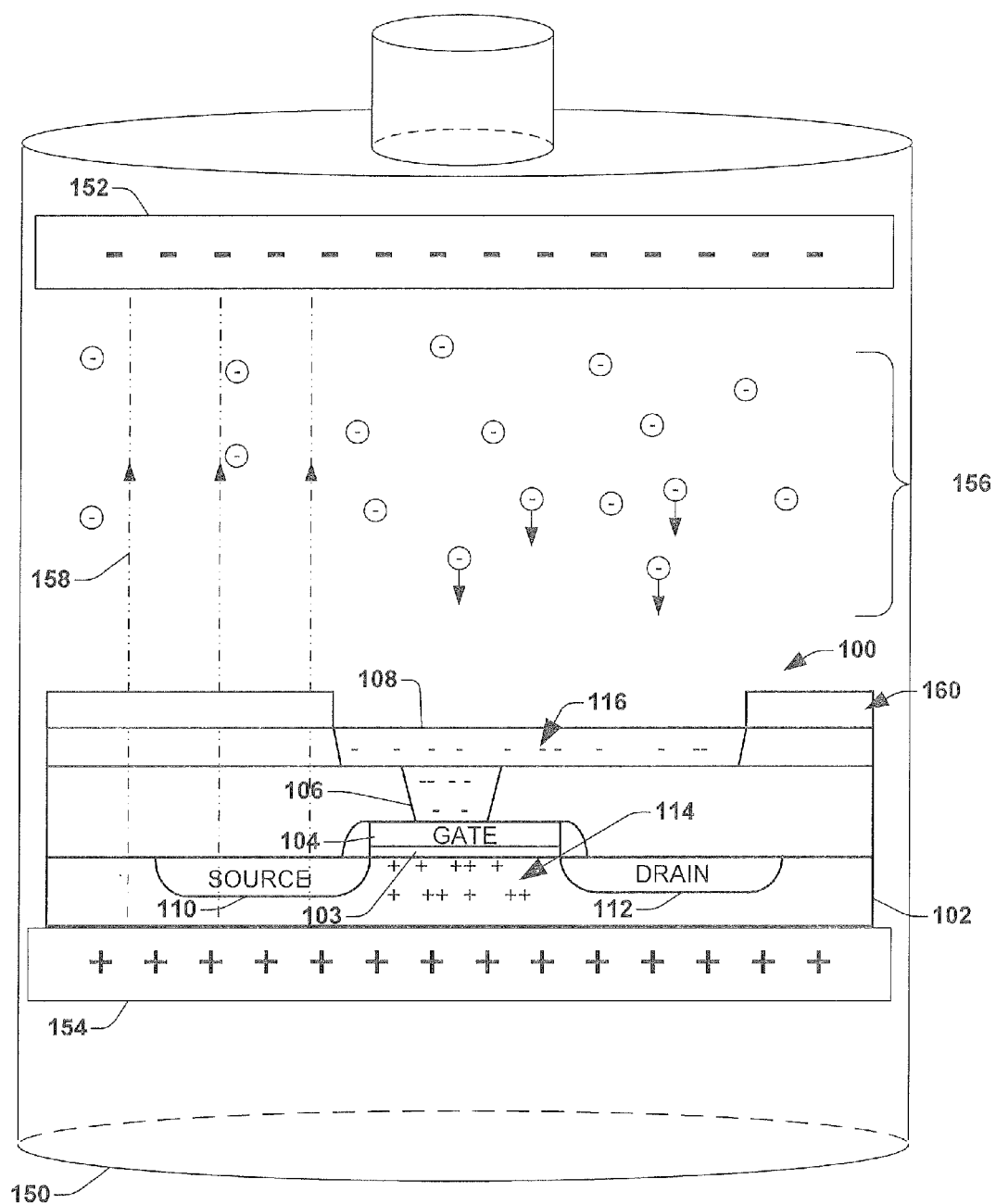
FIG. 1 shows a sample comprising a semiconductor device and metal levels in a simplified plasma etching system.

The present invention will now be described with reference to the attached drawing figures, wherein like reference numerals are used to refer to like elements throughout, and wherein the illustrated structures and devices are not necessarily drawn to scale.

It will be appreciated that semiconductor body as referred to herein may comprise any type of semiconductor body (e.g., silicon, SiGe, SOI) such as a semiconductor wafer or one or more die on a wafer, as well as any other type of semiconductor and/or epitaxial layers formed thereon and/or otherwise associated therewith.

FIG. 1 illustrates a semiconductor device 100 in the form of a metal oxide field effect transistor (MOSFET). The MOSFET is formed in a semiconducting body 102. FIG. 1 shows a gate contact 106 connecting the MOSFET gate 104 to a first metal interconnect level 108. Additional contacts attached to the source 110 and drain 112 (not shown) would also be used in operation of the device to selectively applying biases to the source 110 and drain 112.

To make both the front end of the line (FEOL) and back end of the line (BEOL) features of the MOSFET shown in FIG. 1, plasma etching or reactive ion etching (RIE) processes are often used. On the BEOL, RIE etching is widely used in the formation of metal levels.

RIE etching is typically done in a vacuum chamber 150 comprising two electrodes, 152 and 154, as shown in FIG. 1. The vacuum chamber 150 is filled with a gas. The gas used may vary depending on the material being etched. For example, polysilicon may be etching with a $HBr/O_2$ mixture while aluminum may be etched with a $SiCl_4/Cl_2$ mixture. Many other alternative etch recipes may also be used.

A potential difference is established between the electrodes, 152 and 154, making a strong electromagnetic field 158 in the chamber. The electromagnetic field may be set to a frequency of 13.56 MHz, for example. The electromagnetic field will strip the electrons from the gas creating an ionic plasma 156. Additionally, the electromagnetic field 158 will accelerate the ions 156. If the polarities of the electrodes are set properly the ions 156 are accelerated towards the substrate 100 and by colliding with the substrate 100 perform the desired etching. A hard mask 160 is used to protect areas that are not to be etched.

The collision of charged ions 156 with an electrically isolated substrate 100 causes the build up of charge on the conductive layers, 104 and 108, of the substrate. The build up of charge at the gate electrode 104 of the device creates a potential difference across the gate oxide 103. FIG. 1 shows the buildup of negative charges 116 on the exposed first metal level 108 (and therefore the associated gate 104) and positive charges 114 within the channel of the device. If the buildup of charge becomes large enough, the charge may short through the gate oxide 103 causing dielectric breakdown damage to the device associated device. Depending on the severity of the damage to the oxide the device may either fail to meet device specs, have a reduced lifetime, or may not work at all. While FIG. 1 shows negative charges 116 building up on the first metal level 108 and gate 104 of the device, the built charges can have either a positive or negative polarity depending on the plasma etch or RIE process used.

Plasma charge damage can be controlled to some extent by groundrules, but the data leading to these rules is usually empirically obtained and the groundrules do not show up until late in the development stage of a technology. Therefore, controlling plasma charge damage through groundrules will often drive costly redesign and may further cause geometric restrictions which are costly to silicon area. Plasma charge damage can also be controlled through additional circuitry being added to provide a release value for the buildup of positive or negative charges on the gate of the device.

Figure 2A:
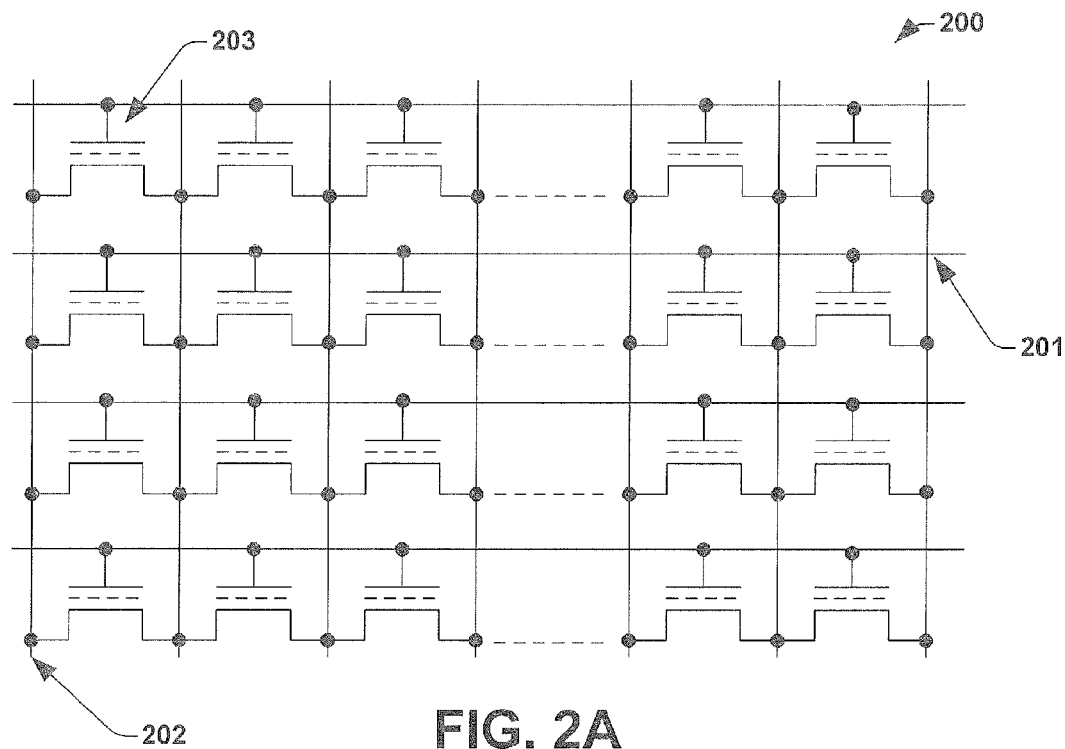
FIG. 2A shows a schematic diagram of an exemplary flash memory array.

An exemplary structure of a flash memory array 200 is shown in FIG. 2A. Flash memory arrays are based on a typical memory array structure, comprising word lines 201 and bit lines 202. The word lines 201 of the flash memory array 200 electrically connect rows of memory cells 203 together forming memory words. Bit lines 202 run perpendicular to the word lines and connect columns of memory cells 203 together. By applying electrical pulses to word lines 201 and bit lines 202 of the memory array, memory cells 203 can be written, erased, and read.

Figure 2B:
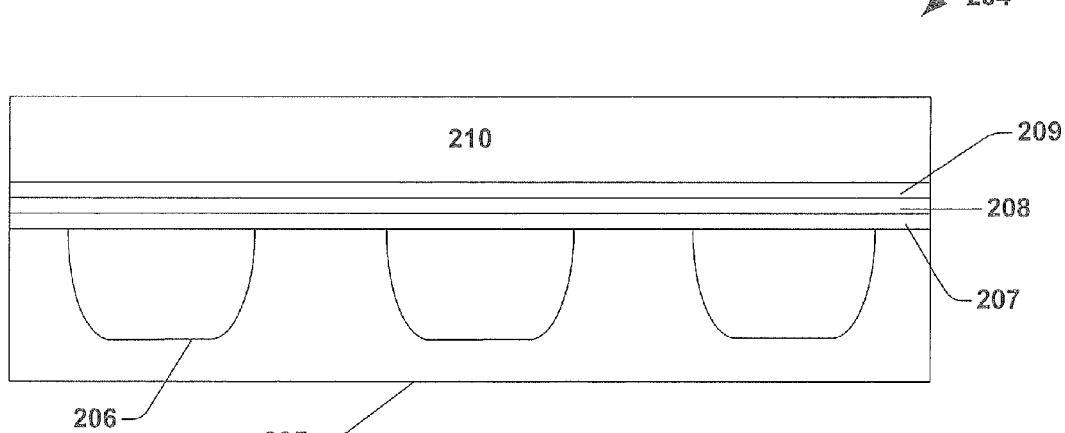
FIG. 2B shows a cross sectional view of a flash memory cell.

FIG. 2B shows a cross-sectional view of an exemplary flash memory array 205. The memory array is built in a semiconducting body 206. The substrate is covered with a composite charge trapping layer comprising a lower insulating/dielectric layer 207, a charge trapping layer 208, and an upper insulating dielectric layer 209. The word line 210 comprises a long line of gate electrode material (e.g., polysilicon) over the composite charge trapping layer. The bit lines 206 of FIG. 2B are buried bit lines comprising well diffusion regions. The device operates by storing charges in the charge trapping layer 208 through various applications of voltage to the gate (i.e., word line 210), drain/source (i.e., bit line 206) and source/drain (i.e., bit line 206) of the device. The amount of charge stored in the charge trapping layer 208 is associated with a particular data state.

Figure 3A:
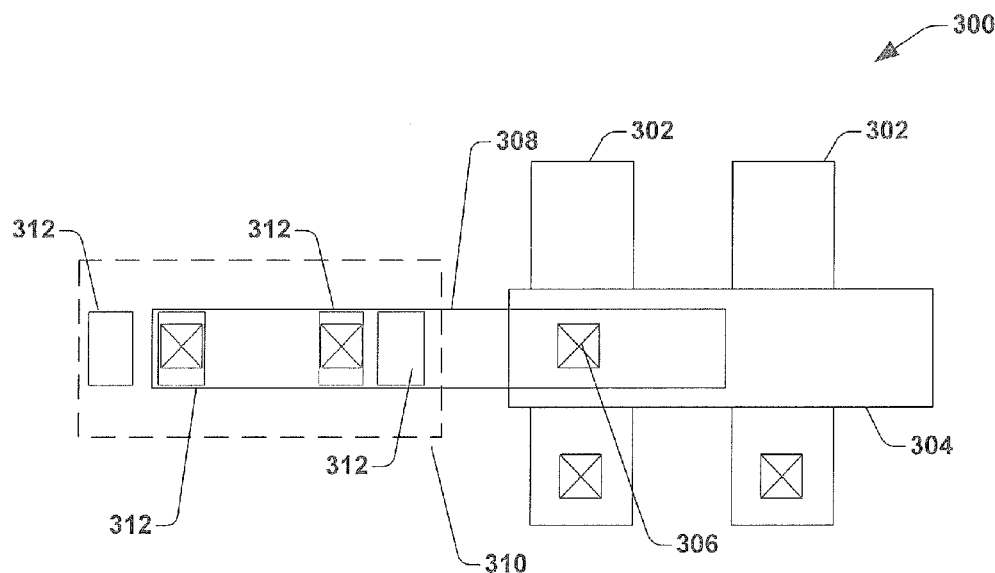
FIG. 3A shows a top view of a flash memory array connected to a junction circuit through a metal 1 level.
Figure 3B:
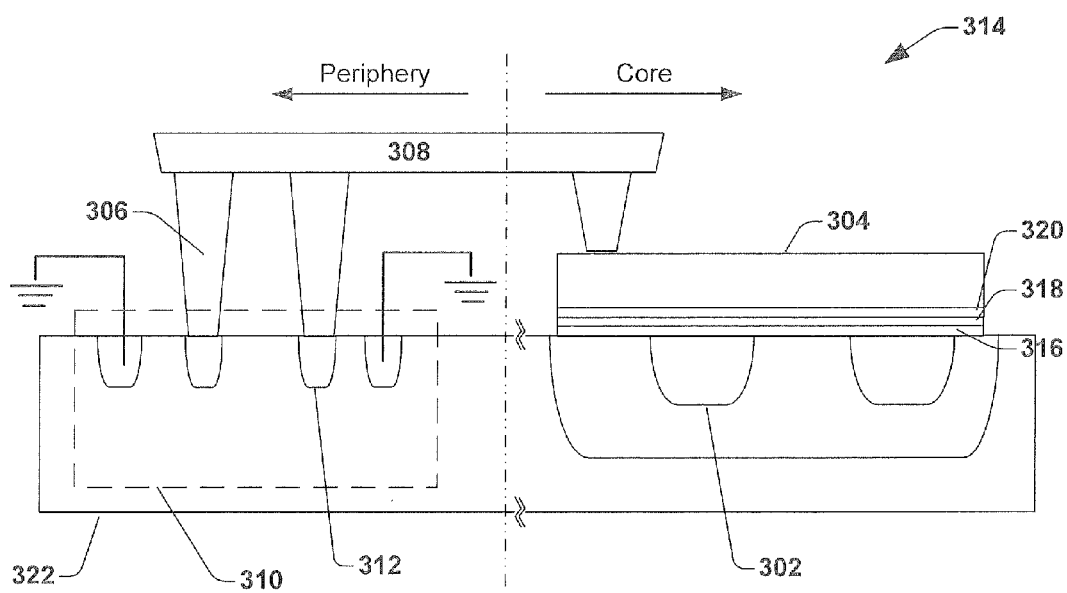
FIG. 3B shows a cross-sectional view of a flash memory array connected to a junction circuit through a first metal level.

Flash memory is especially susceptible to plasma charge damage due to the extremely thin oxide layers used in the devices. For example, the tunneling oxide between the substrate and the charge storing layer may only be 50-100 Angstroms thick. FIG. 3A and 3B show the bit lines 302 and a word line 304 of a flash memory array 300 and 314. The word line 304, formed over a lower insulating/dielectric layer 316, a charge trapping layer 318, and an upper insulating dielectric layer 320, is connected to a junction circuit 310 by way of contacts 306 and a first metal level 308. A junction circuit 310 is a circuit which is added to an integrated chip to dissipate charges that build up from plasma or RIE etching. When large amounts of charge build up on a word line 304, the junction circuit 310 will act as a safety value. The built up charges will discharge through the low resistance metal path to the junction circuit 310 and subsequently to a discharge terminal (e.g., ground), rather than damaging the lower insulating/dielectric layer 316. The exemplary junction of FIGS. 3A and 3B comprises two devices formed from two well implants 312 in the substrate 322. The two devices could comprise two NMOS transistors in a p-type substrate 322, for example. The two devices could alternatively comprise an NMOS and a PMOS device or two PMOS devices, for example.

Often the junction circuit 310 is located within the periphery of the memory array, wherein the term periphery is used to refer to circuitry located outside of the memory array or core. In practice, junction circuits are built to occupy as small an area as possible since the area used to make such structures reduces functional silicon area and therefore is costly from an economic point of view. The junction circuit can be made as a byproduct of the decoder circuit. When this is done, the junction circuit will use circuitry already existing for the purpose of the decoder. For example, a decoder may comprise a junction between two transistors used to pull the wordline to high or low values. The word line can be tied to this junction and use it to dissipate the charge buildup of the word line.

Figure 4A:
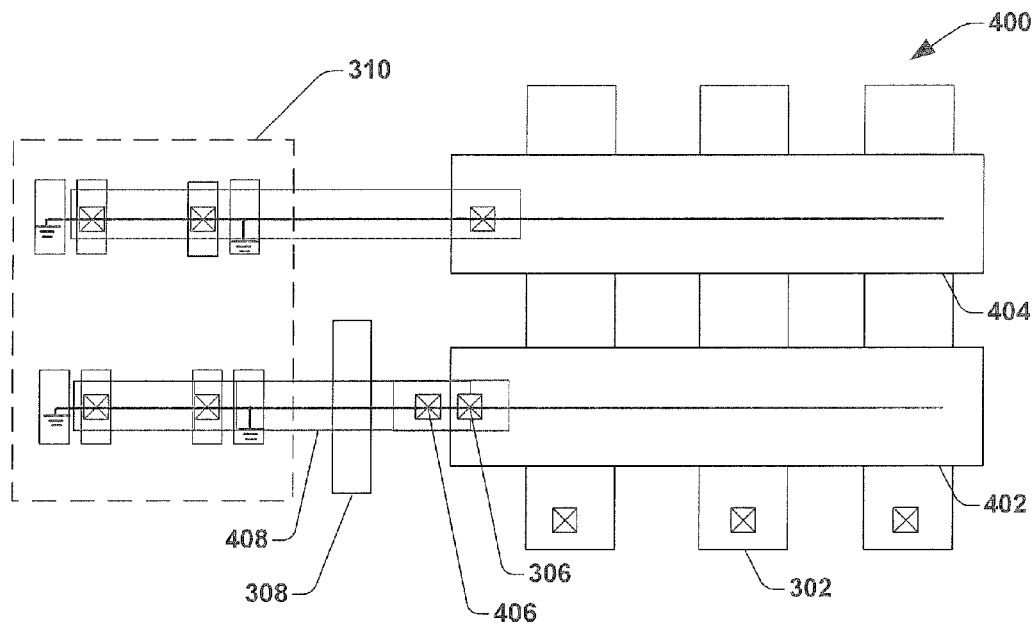
FIG. 4A shows a top view of a flash memory array connected to a junction circuit through a first and a second metal level.
Figure 4B:
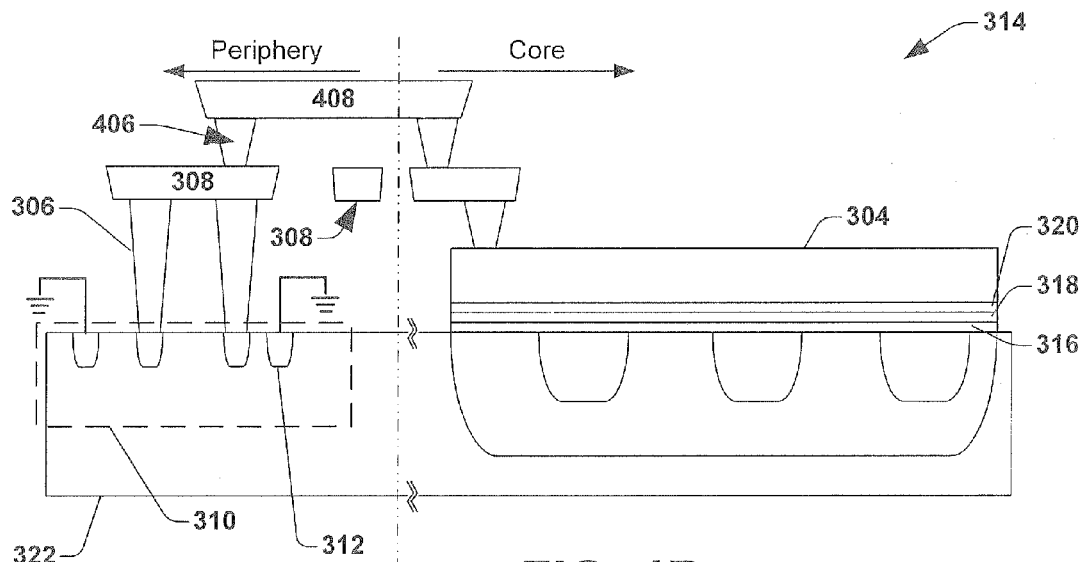
FIG. 4B shows a cross-sectional view of a flash memory array connected to a junction circuit through a first and a second metal level.

In the integrated chip layouts of emerging technology nodes flash memory arrays are becoming increasingly dense. The increasing density of the devices at times requires smaller metal wiring pitches to properly connect the wordline of the memory core to the junction of the periphery. In certain situations, it is even necessary to use both a first and a second metal level to connect the word line of the memory array to the junction circuit. This situation is shown in FIG. 4A and 4B, where the use of a second metal level 408 is necessary to get around an impinging first metal wire 308. FIG. 4A also includes a schematic diagram of the circuit of the memory array. The use of a second metal level creates a problem for processing during the formation of the first metal level 308 and the first via level 406. During the formation of these levels the connection between the memory word line 304 and the junction circuit 310 does not exist yet since the second metal level 408 has not been built. Therefore, any charges that build up during the formation of the contact or first metal level have no safe path for dissipation and may damage the device.

Figure 5A:
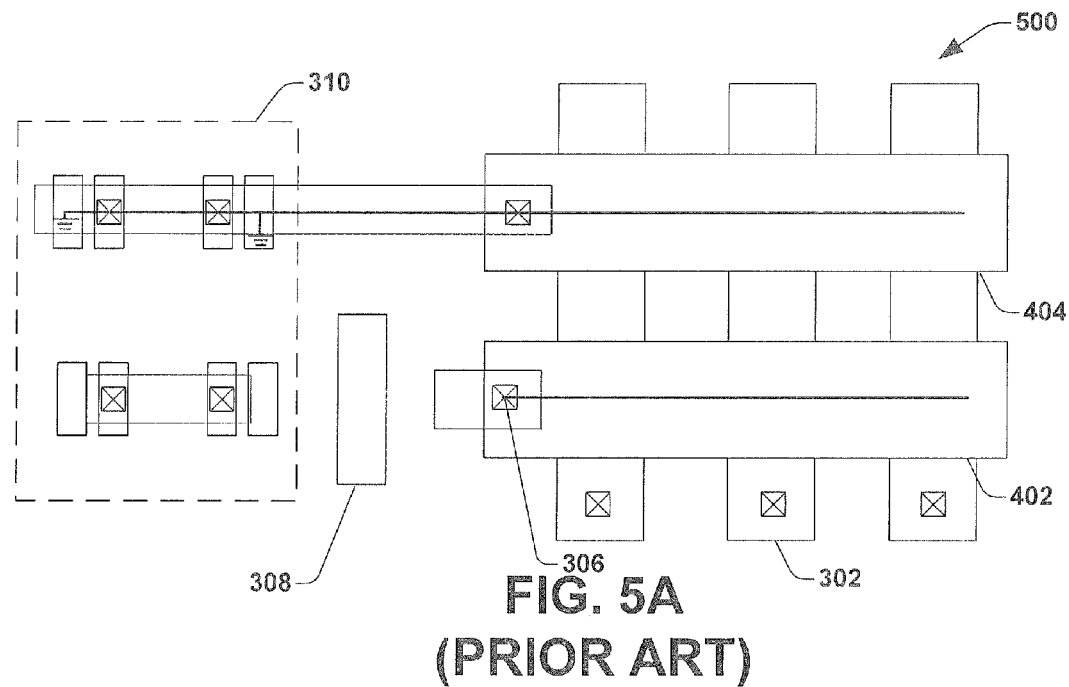
FIG. 5A shows the memory array of FIG. 4A without the second metal level formed.
Figure 5B:
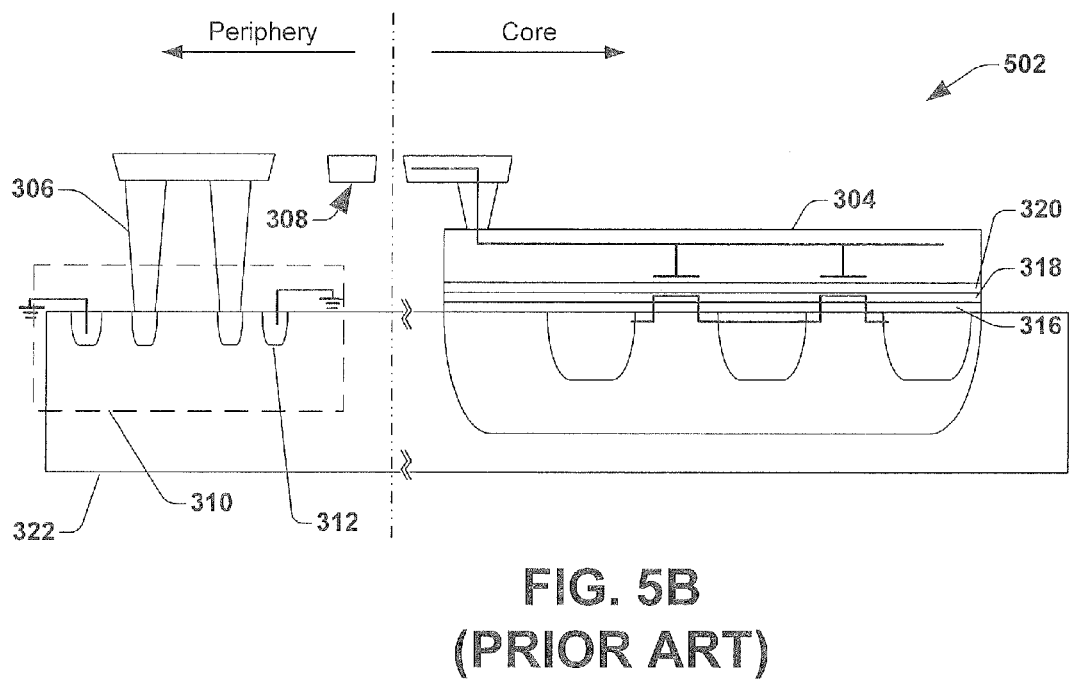
FIG. 5B shows the memory array of FIG. 4B without the second metal level formed.

FIG. 5 shows a situation in which the second metal level has not yet been formed. In this figure the schematic diagram of the circuit of the memory array is also shown. If a plasma etching is used to form the first metal level 308, charges will be collected by the exposed first metal level 308 and transferred to the word line 304. As is clear in FIG. 5A and 5B, there is no direct path by which the charges can dissipate to the discharge terminal. If enough charges build up, the lower insulating/dielectric layer will breakdown.

One embodiment of the disclosed invention is a memory array that provides protection from plasma charge damage. In particular, this embodiment guards against the situation shown in FIG. 5A and 5B, where a conductive path between the word line 304, located in the core, and the discharge junction 310, located in the periphery, does not exist.

Figure 6A:
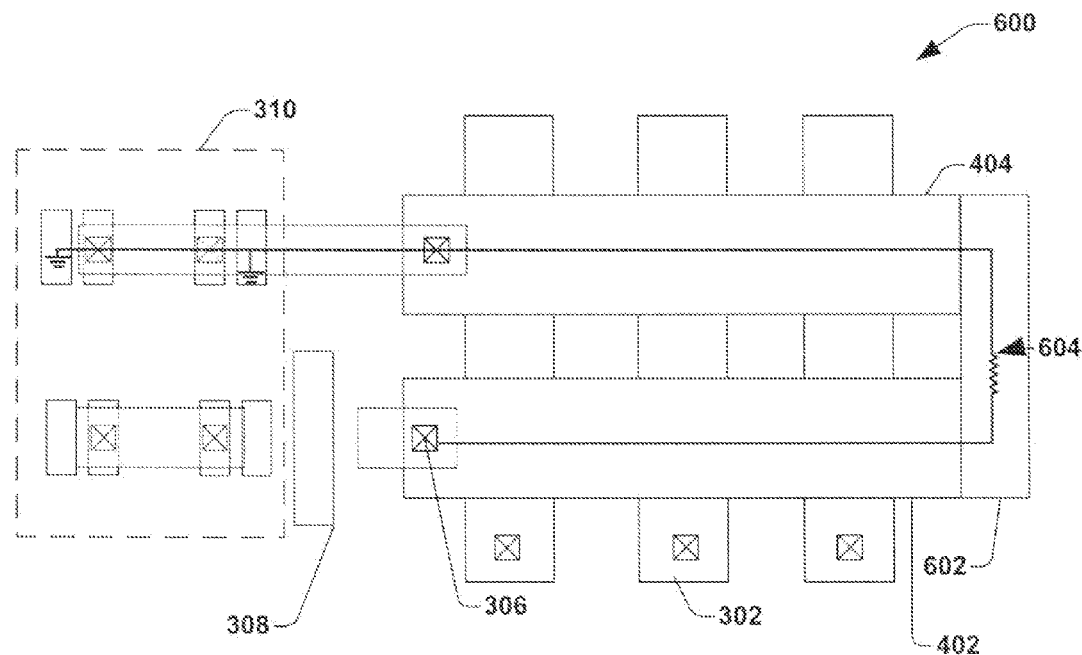
FIG. 6A shows the memory array of FIG. 5A further comprising a high resistance shorting path between word lines abutting the edge of the word lines.
Figure 6B:
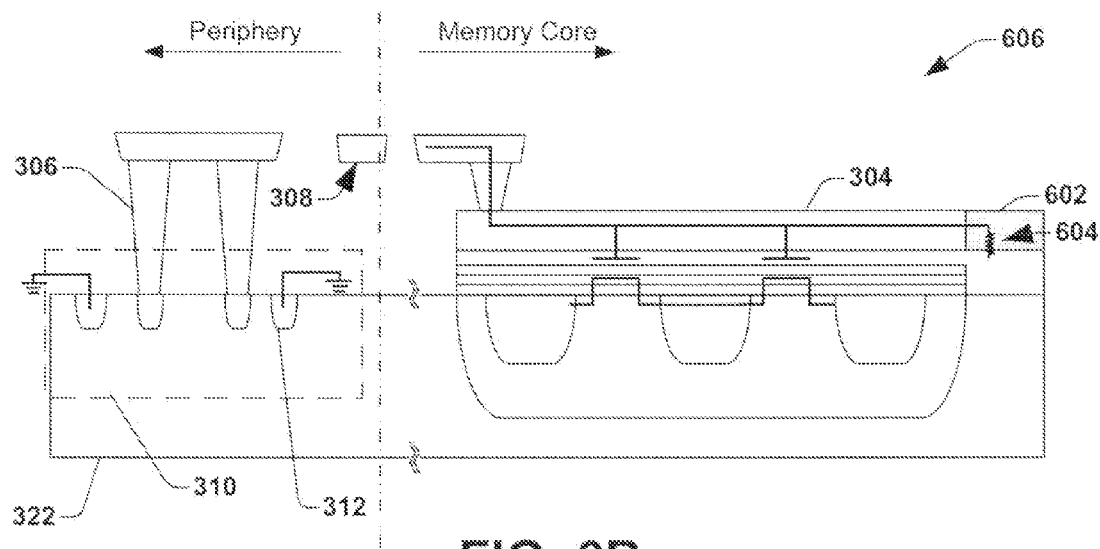
FIG. 6B shows the memory array of FIG. 5B further comprising a high resistance shorting path between word lines abutting the edge of the word lines.

FIGS. 6A and 6B show this embodiment. The word lines 304 are each coupled to a shorting path 602 which connects the word lines of the memory array together. The shorting path comprises a high resistance, undoped gate electrode layer (e.g., polysilicon) creating a high resistance optional path for the dissipation of charges that build up on a word line 402 which does not have a low resistance connection to a discharge junction. The resistance of this layer is high enough for each word line to be effectively isolated for purposes of turning on individual word lines, but low enough that word lines can short upon a sufficiently large charge buildup. For example, the resistance of this layer may be on the order of 10's of Mega Ohms. In FIGS. 6A and 6B, the shorting path 602 is schematically represented by a resistor 604 located between the first word line 402 and the second word line 404.

As shown in the example of FIG. 6A, the word line 402 is connected to a discharge junction 310 through a second metal level which is yet to be built. The charges will build up on the word line 402 during a plasma etching or RIE process. When the potential of the charges increases to a high enough magnitude the charges will dissipate through the shorting path 602 to the neighboring word line 404 which has a direct connection to a discharge junction 310.

Figure 7:
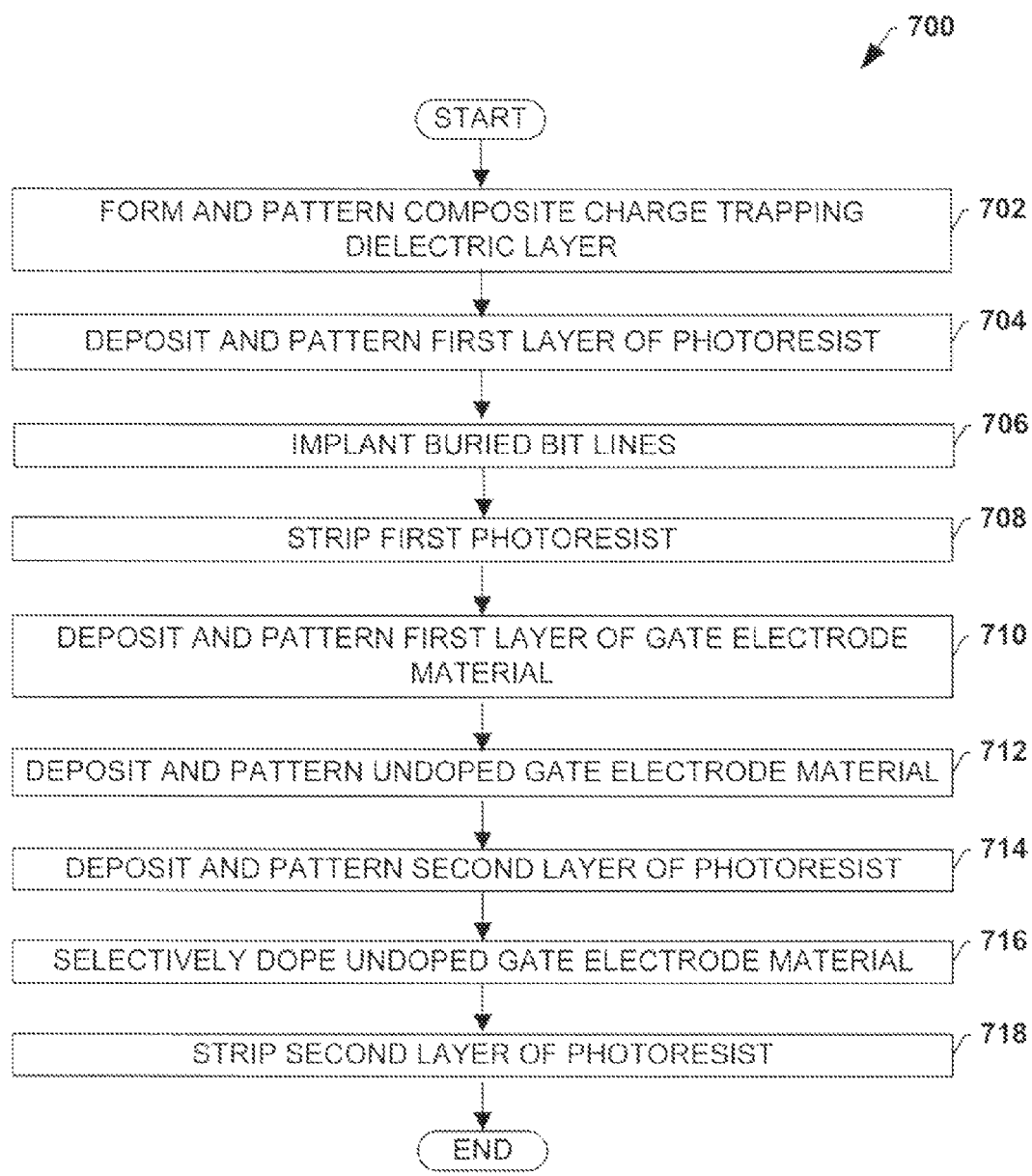
FIG. 7 is a flow diagram illustrating an exemplary methodology for forming the embodiment of FIG. 6A and 6B.
Figure 8:
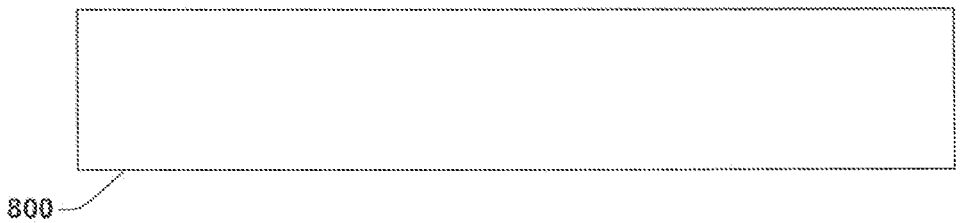
FIGS. 8-19 show cross sectional views of the method described in FIG. 7.
Figure 9:
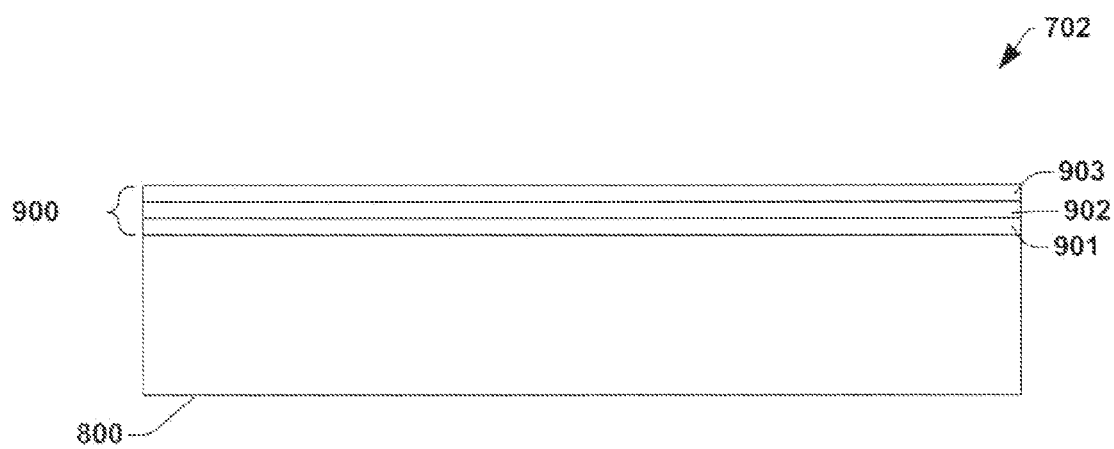
Figure 10:
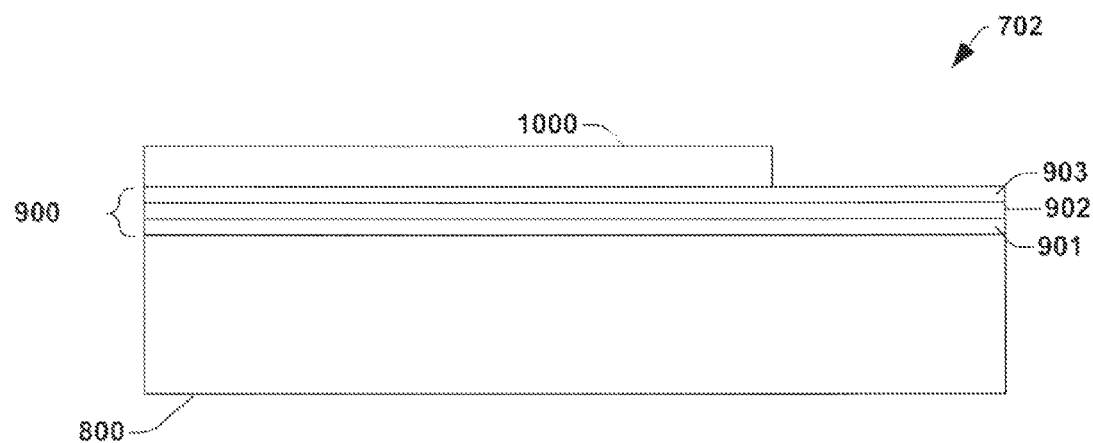
Figure 11:
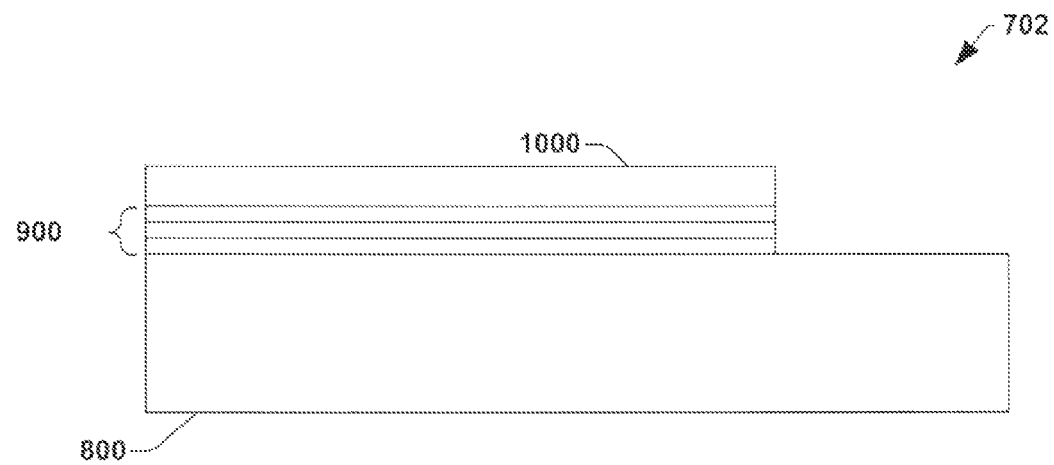
Figure 12:
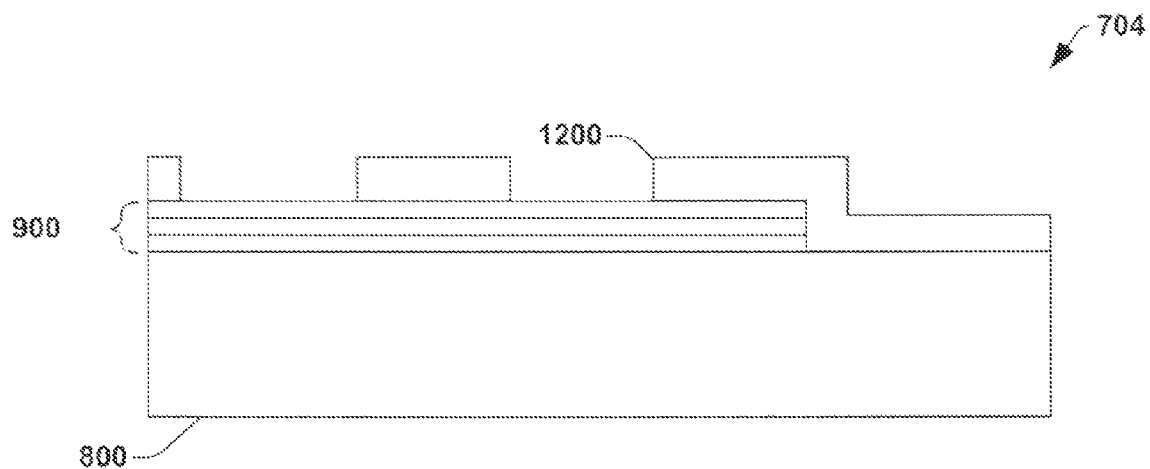
Figure 13:
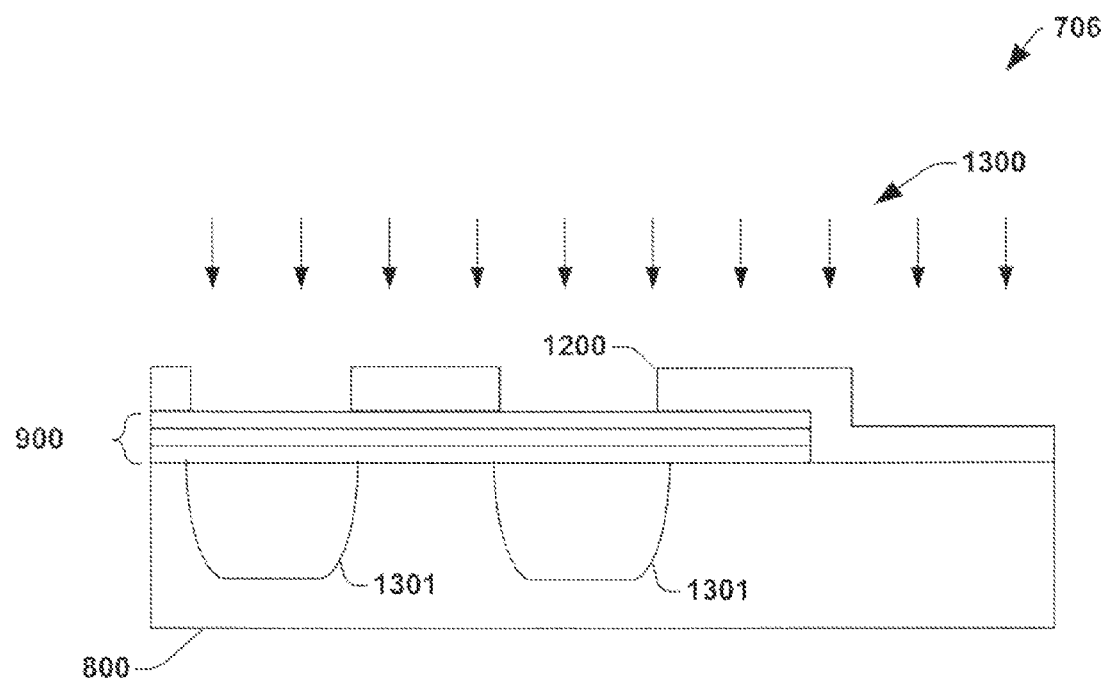
Figure 14:
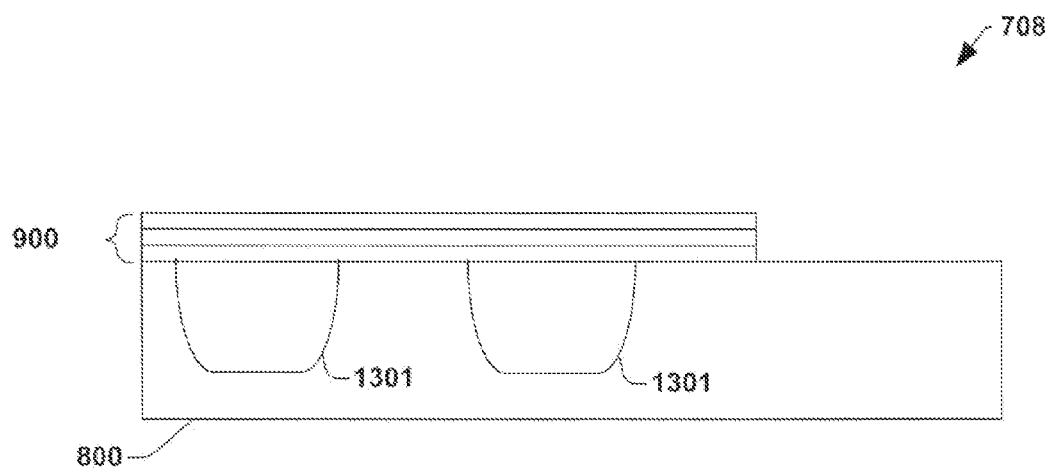
Figure 15:
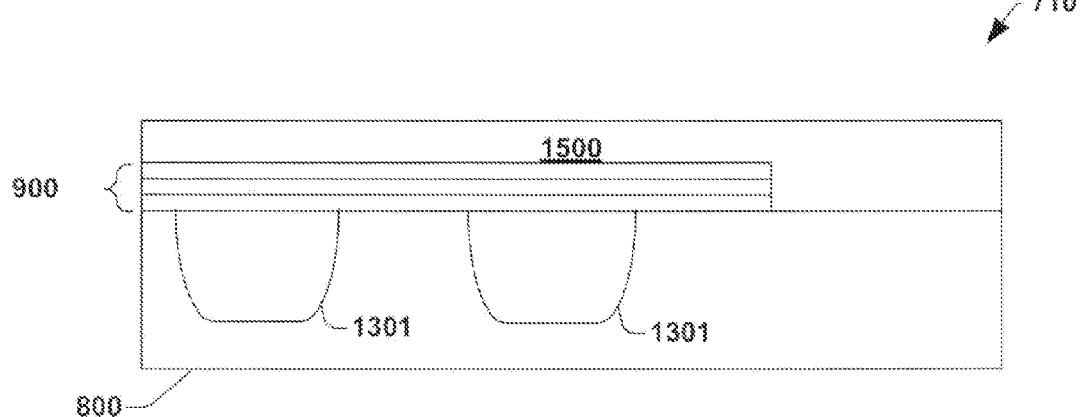
Figure 16:
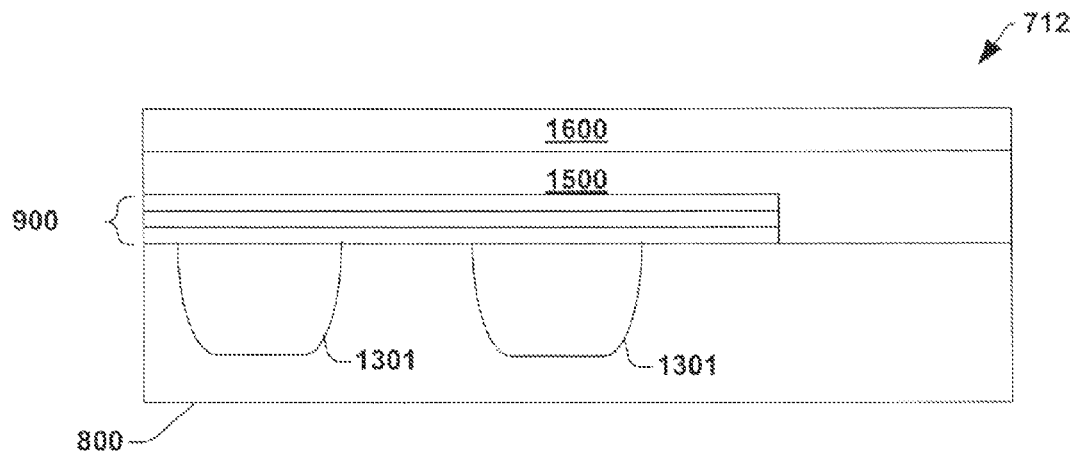
Figure 17:
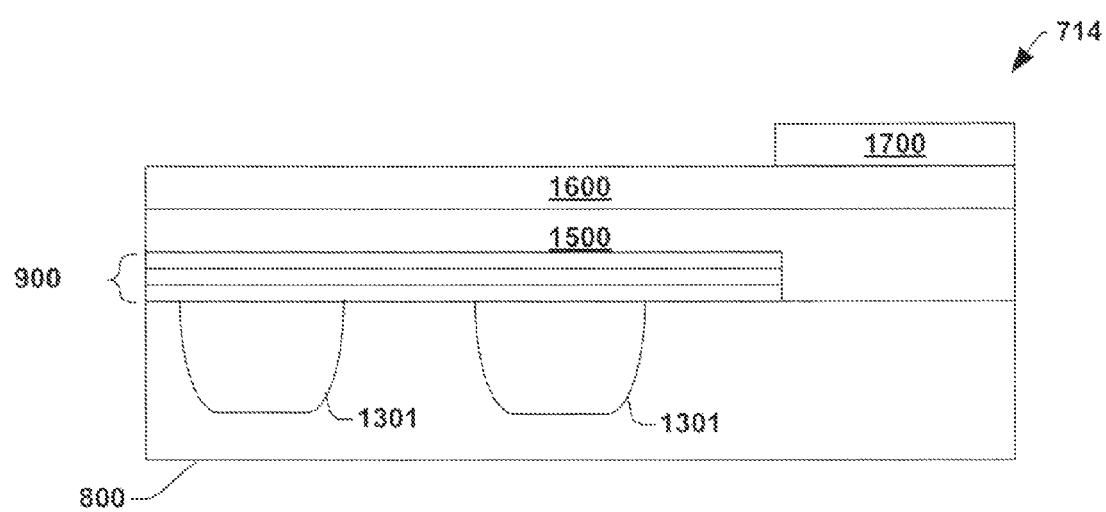
Figure 18:
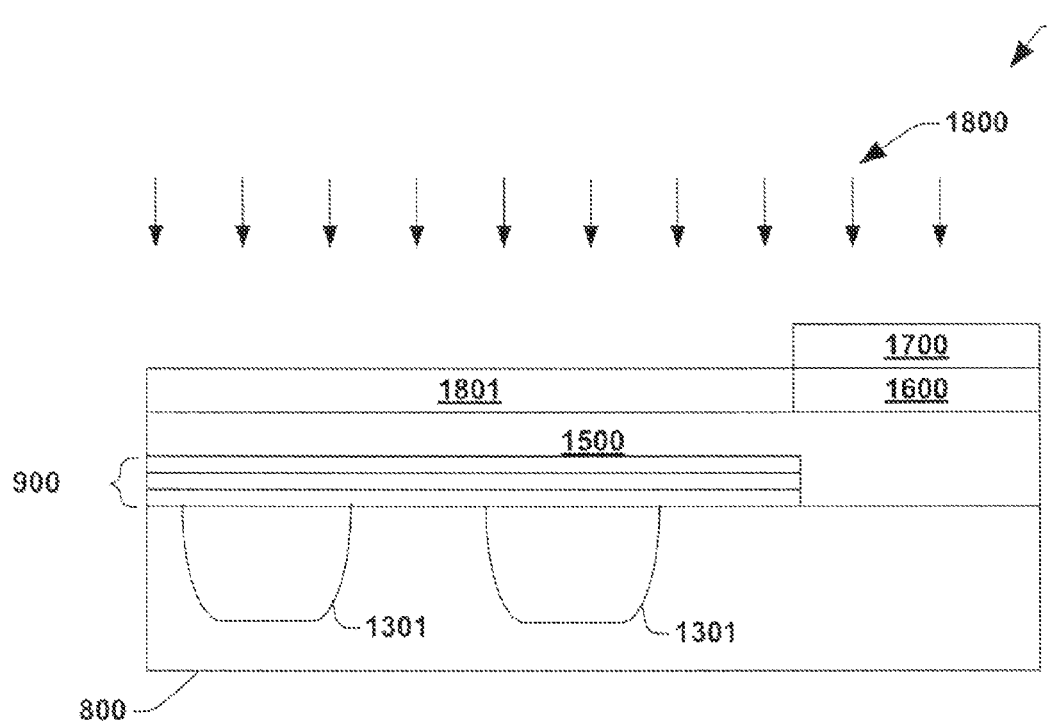
Figure 19:
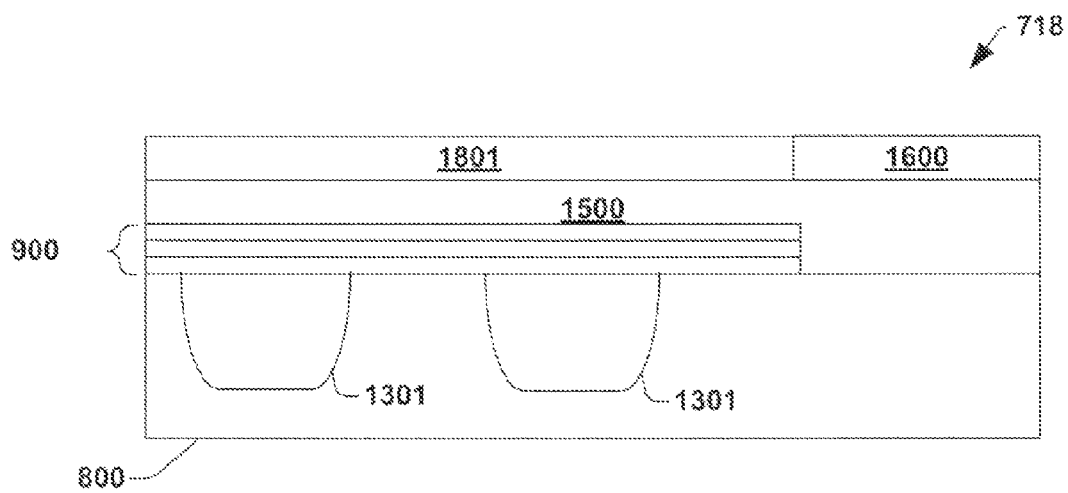

FIG. 7 shows an alternative embodiment, an exemplary methodology 700 for forming a dual bit memory device further comprising an embodiment of the disclosed invention. The disclosed invention is not limited to the fabrication of a dual bit memory device but is illustrated as such in example. While method 700 of this disclosure is illustrated and described below as a series of acts or events, it will be further appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

In the examples shown in FIGS. 8-19 and 23-26, it is supposed that semiconductor regions are doped using either dopant implantation or deposition of a doped material at the surface of the semiconductor material followed by diffusion into the semiconductor material. Patterned doped regions are assumed to be obtained by means of traditional lithographic techniques, for example, where lithography broadly refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., doped).

Methodology 700 begins with a substrate 800. At 702, a composite charge trapping layer 900 is formed and patterned on top of the substrate 800. The composite charge trapping layer 900 comprises a lower insulating/dielectric layer 901, a charge trapping layer 902, and an upper insulating/dielectric layer 903. The lower and upper insulating layers, 901 and 903, may comprise an oxide dielectric such as silicon dioxide ($SiO_2$). The charge trapping layer 902 may be comprised of a suitable material such as silicon nitride. The composite charge trapping dielectric layer 900 may be comprised of other materials and layers including, but not limited to an oxide-nitride-oxide (commonly referred to as an ONO) layer an oxide/bitride bilayer dielectric, a nitride/oxide layer dielectric, an oxide/tantalum oxide layer ($SiO_2/Ta_2O_5$), an oxide/strontium titanate/oxide layer ($SiO_2/SrTiO_3/BaSrTiO_2$), and the like. The inventors have also contemplated that the second insulating layer can be comprised of a high-k dielectric material. The lower insulating/dielectric layer 901, the charge trapping layer 902, and the upper insulating/dielectric layer 903 may all have thickness between 50 and 100 Angstroms, with the lower insulating/dielectric layer 901 thinner than the upper insulating/dielectric layer 902.

The composite charge trapping layer 900 is patterned using a photoresist mask layer. The photoresist mask layer 1000 is deposited onto the composite charge trapping layer 900 (FIG. 10) and patterned so that a photoresist opening contacts the designed location of the plurality of word lines by either intersecting or abutting the location where the word lines are designed. The composite charge trapping dielectric layer 900 is etched away from areas not covered by the photoresist layer 1000, leaving a bare substrate in the area where the photoresist was open. Alternatively, the photoresist mask layer 1000 could be deposited prior to the formation of the composite charge trapping layer 900. If done in this manner the composite charge trapping layer 900 formation would be prohibited in the location of the photoresist 1000. Subsequent to the etching of the composite charge trapping dielectric layer the photoresist mask layer 1000 is stripped away.

A first photoresist layer 1200 is deposited onto the substrate at 704. The first photoresist layer 1200 is patterned so that it is open over the location where the bit lines of the memory array will be formed.

A bit line implant 1300 is performed at 706. The bit line implant 1300 establishes the buried bit lines 1301 within the semiconductor substrate 800. The bit line implantation 1300 will form wells 1301 in the areas of substrate where the second photoresist 1200 layer is open. The bit line implant 1300 can include an n-type dopant such, such as Arsenic, or a p-type dopant such as boron depending on the substrate 800 doping. The buried bit lines 1301 can be formed to relatively shallow depths of between about 300 and 500 angstroms. Additionally, the bit line implant 1300 may be performed at a dosage of about $1E15/cm^2$ for a resulting concentration of about $2E20/cm^3$, for example.

At 708 the first photoresist layer is stripped away. Photoresist is usually removed by a mixture comprising a combination of solvents. The mixture may vary depending on the photoresist and photoresist remover used.

At 710 a first layer of gate electrode material 1500 is deposited onto the substrate 800. The first layer of gate electrode material 1500 may comprise polysilicon and will be formed in the core and the periphery of the memory array, for example. Usually an undoped gate electrode material is deposited and then doped. A hard mask or photoresist mask is also used to pattern the first layer of gate electrode material layers into parallel strips located in the position where the memory word lines are designed. A dielectric material is formed to separate the word patterned gate electrode material. In an alternative embodiment the first layer of gate electrode material 1500 is etched away from the core of the memory array and left only on the periphery circuitry of the memory array. In an alternative embodiment, the first layer of gate dielectric may also be removed from the open area defined by the photoresist mask at 702.

At 712 a layer of undoped gate electrode material 1600 can be formed over the first layer of gate electrode material. The undoped gate electrode material layer 1600 can be formed to a thickness of between 900 and 1100 angstroms, for example. Without further doping the undoped gate electrode material will have a high resistance. A hard mask or photoresist mask is used to pattern the first layer of gate electrode material layers into parallel strips forming memory array word lines. A dielectric material is formed to separate the word patterned gate electrode material.

At 714 a second photoresist layer 1700 is deposited and patterned on the undoped layer of gate electrode material 1600. The second photoresist layer 1700 is patterned such that the photoresist 1700 masks a region of the undoped gate electrode material intersecting or abutting the location where the word lines are designed. The undoped gate electrode material in the masked region will form the shorting path between the word lines of the memory array. The size of the masked region will vary depending on the desired resistance of the shorting path. For example, a wider shorting path will provide lower resistance shorting path.

The gate electrode material 1600 is then doped through an implant 1800 at 716. The doping will create a layer of conductive gate electrode material 1801 which will form the memory array word lines abutting or undoped gate electrode region 1600. At 718 the second photoresist layer 1700 is stripped away.

The gate electrode material can be doped, for example, utilizing diffusion, in situ doping, ion implantation, and the like. Diffusion doping comprises, for example, depositing a heavily-doped silicon glass over the poly-1 with the glass serving as the source of dopant for the poly-1. The dopant diffusion can take place at a temperature of, for example, 900-1000 deg. C. Ion implantation comprises directly bombarding the poly-1 layer with high-energy ions, for example, while in situ doping employs dopant atoms that are established in the semiconductor during its growth, commonly during epitaxial growth of semiconductor layers, for example. In the case of using ion implantation to dope the poly-1, beside blanket implantation, an implantation mask can also be used to achieve doping to selected area and other techniques known by those of ordinary skill in the art.

Figure 20:
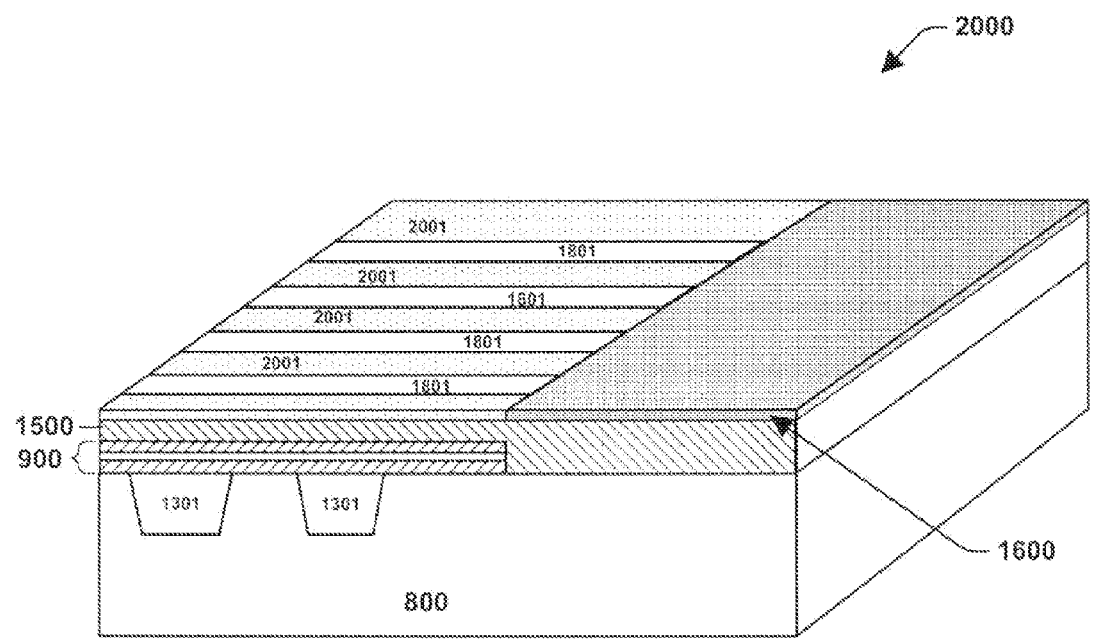
FIG. 20 shows a three dimensional overview of the device built by the method of FIG. 7.

FIG. 20 shows a three dimensional view of a memory array 2000 after the formation of the word lines. The memory array comprises a substrate 800 including buried bit lines 1301 and covered with a composite charge trapping layer 900. The undoped gate electrode region 1600 is abutting the memory word lines 1801. The word lines 1801 are separated by dielectric material 2001.

Figure 21A:
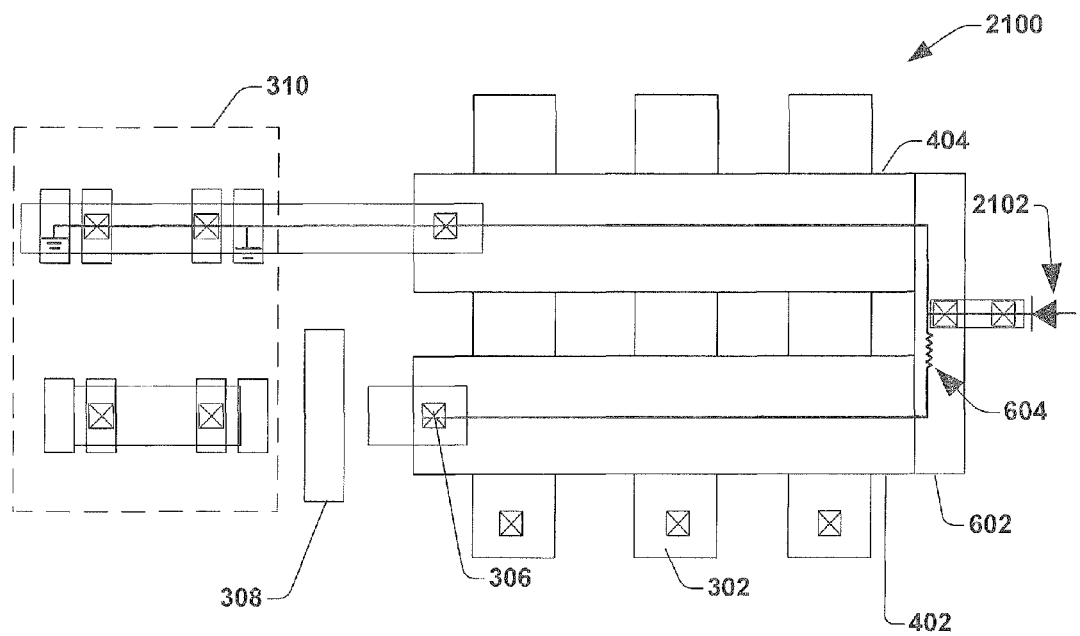
FIG. 21A and 21B show an additional embodiment of the disclosure comprising a diode coupled to the memory array word lines.
Figure 21B:
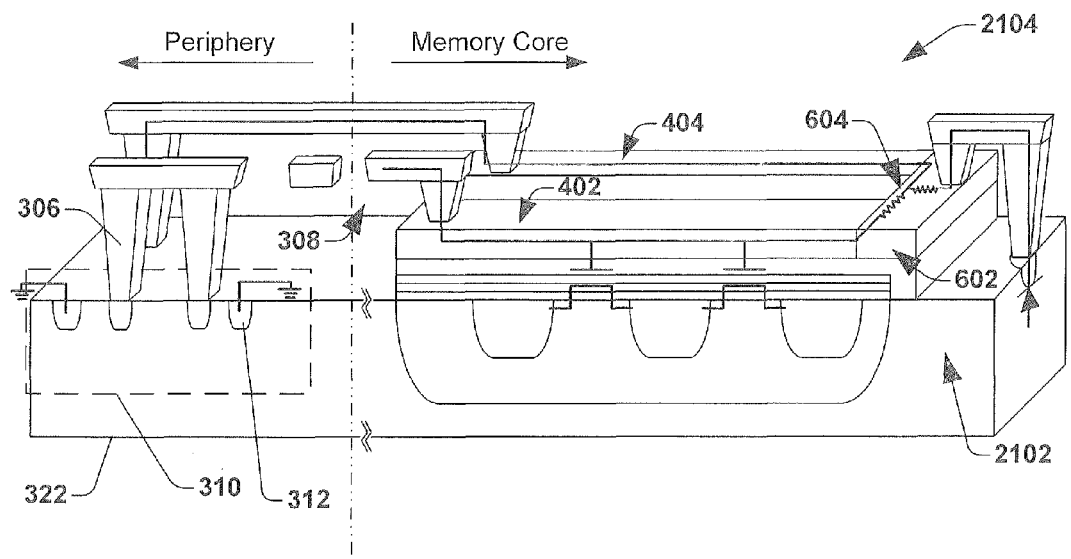

An additional embodiment is shown in FIGS. 21A and 21B. The alternative embodiment comprises a semiconductor diode 2102 electrically coupled, by way of a first metal and the shorting path, to the memory word lines, 402 and 404. The diode of FIGS. 21A and 21B will act as an additional safety value for charges amassing on the word lines 402 and 404.

Figure 22:
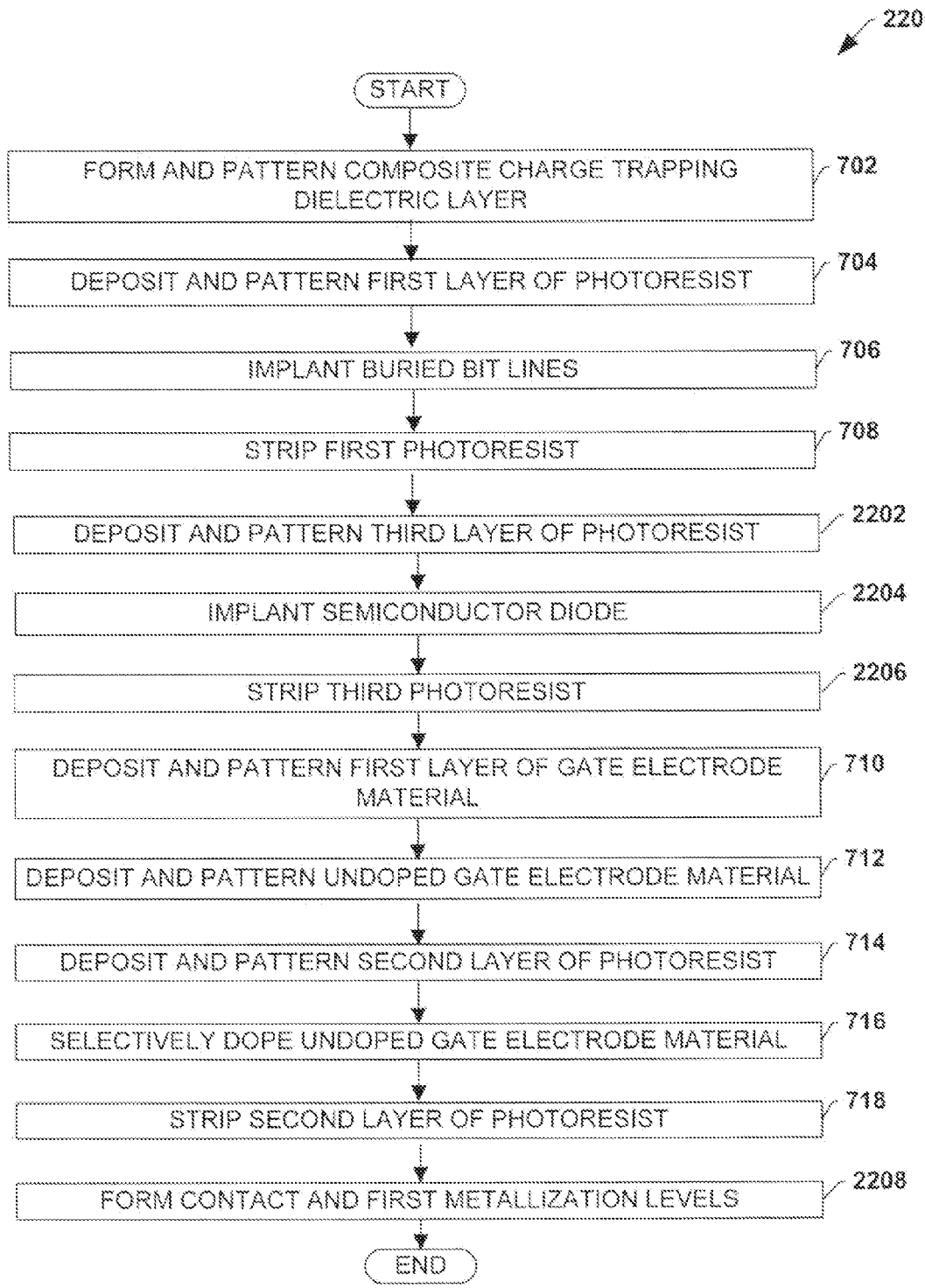
FIG. 22 is a flow diagram illustrating an exemplary methodology for forming the embodiment of FIG. 21A and 21B.
Figure 23:
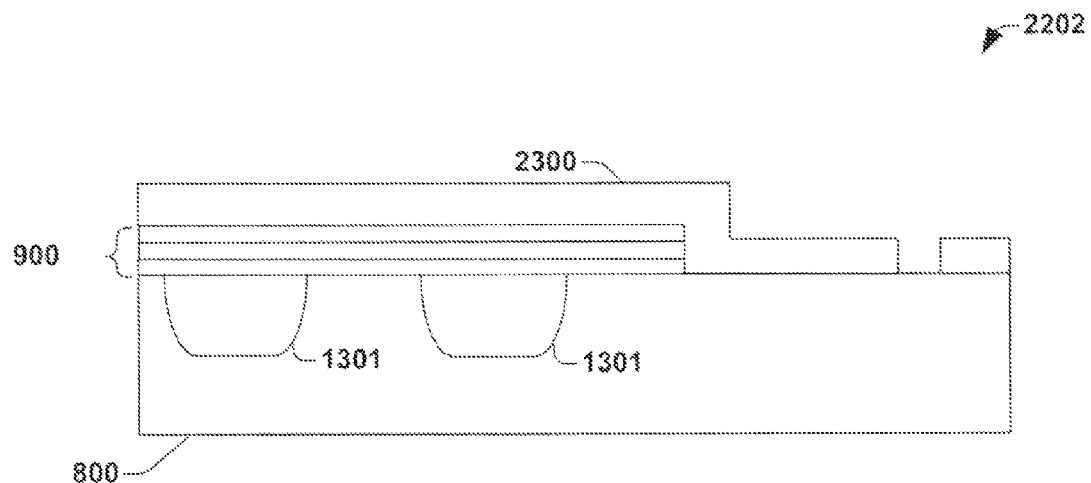
FIGS. 23-26 show cross sectional views of the method described in FIG. 22.
Figure 24:
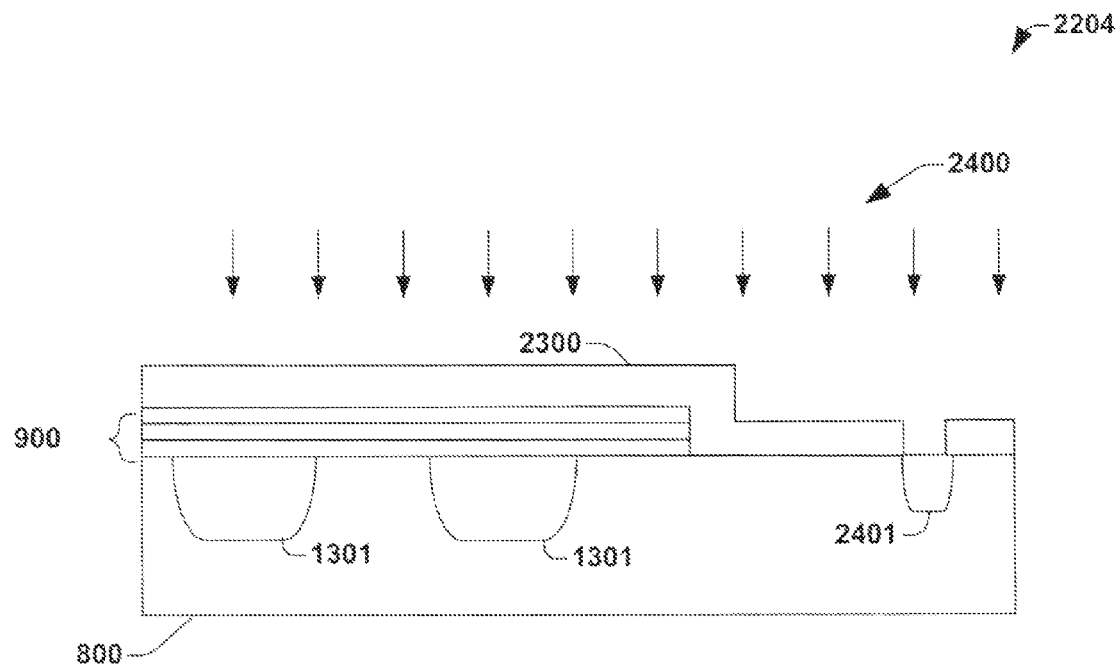
Figure 25:
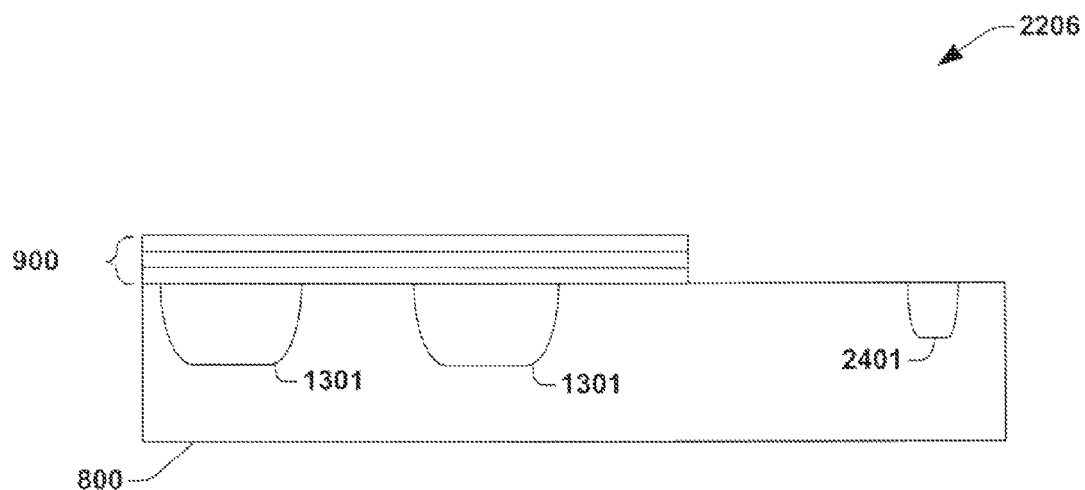
Figure 26:
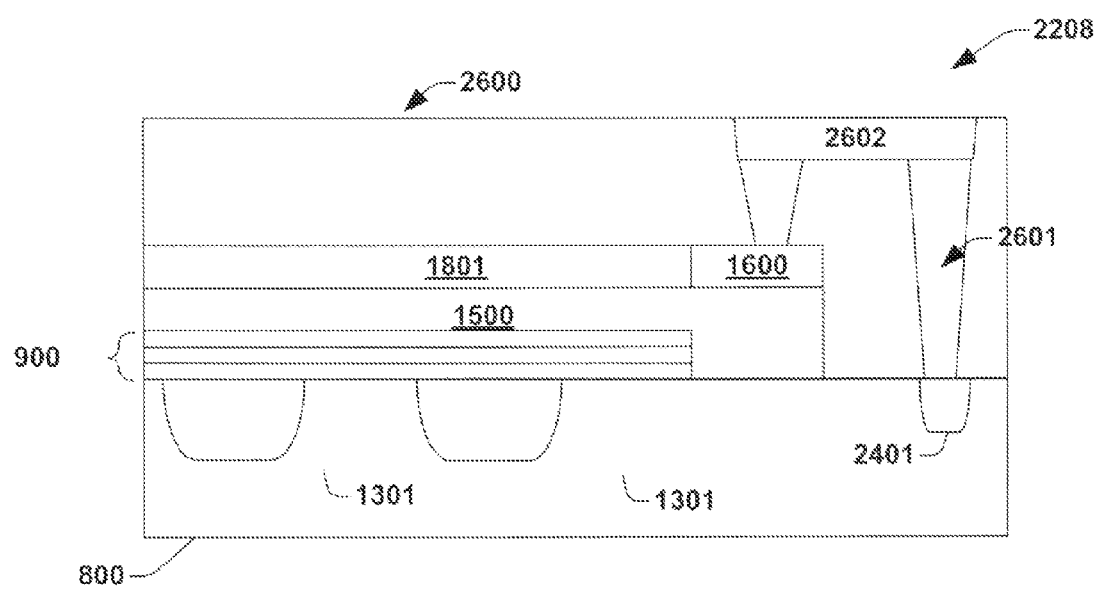

FIG. 22 shows a method for forming the semiconductor diode 2102 of FIGS. 21A and 21B. The method is shown by way of the method of FIG. 7 further comprising additional acts necessary for the diode formation. Acts having the same numerical labeling are equivalent to those shown in FIG. 7 and therefore will not be further explained.

At 2202 a third photoresist layer is deposited onto the composite charge trapping layer. The third photoresist layer is patterned to form an opening above the desired location of the semiconductor diode.

The substrate is implanted at 2204. The third photoresist layer will mask the implant from all areas except the location of the diode. The diode implant 2401 can include an n-type dopant such, such as Arsenic, or a p-type dopant such as boron depending on the substrate 800 doping. The junction depth of the diode may be between 50 nm and 300 nm. Additionally, the diode implant 2401 may be performed at a dosage of about 1E15/cm2 for a resulting concentration of about 2E20/cm3, for example. The implant forms an additional well region into the substrate 800. After the implant is performed the fourth photoresist is stripped away.

At 2208 the contact 2601 and first metal level 2602 are formed to electrically couple the semiconductor diode 2102 the memory word lines, 402 and 404. Contacts 2601 are formed on the undoped shorting path 1600 and on the semiconductor diode 2401. The contacts may be formed by drilling into a dielectric material and filling the hole with a tungsten alloy. The first metal level may comprise aluminum, for example.

In this embodiment the charges will amass on word lines not connected to a discharge junction until such a time as the magnitude of the charge causes the charge to dissipate through the high resistance undoped gate electrode material. When the charges discharge they can either dissipate through the neighboring word line or the semiconductor diode.

In additional embodiment the well region is formed in the same well as the junction circuit. For example, the well implant may be an n-well implant in a p-well of the junction circuit.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory array comprising:
    a first insulating/dielectric layer formed on a semiconducting body;
    a charge trapping dielectric layer formed over the first insulating/dielectric layer;
    a second insulating/dielectric layer formed over the charge trapping dielectric layer;
    at least one bit line formed in the semiconducting body that respectively operates as an acting source and acting drain;
    a discharging circuit, wherein the discharging circuit is electrically connected to a first discharge terminal;
    a first word line formed over the second insulating/dielectric layer and orthogonal to the at least one bit line;
    a second word line formed over the second insulating/dielectric layer and orthogonal to the at least one bit line and parallel to the first word line, wherein the second word line is directly coupled to the discharging circuit exclusively by a contact level and a first metal level; and
    a shorting path electrically connecting the first word line to the second word line, wherein the shorting path comprises a resistance higher than the first word line or the second word line.

2. The memory array of claim 1, wherein the discharging circuit comprises a diode junction.

3. The memory array of claim 2, wherein the diode junction is part of a periphery decoder circuit.

4. The memory array of claim 3, further comprising a semiconductor diode, wherein the semiconductor diode is directly coupled to a second discharge terminal and the shorting path exclusively by the contact level and the first metal level.

5. The memory array of claim 4, wherein the semiconductor diode comprises an n-well implant in a p-well.

6. The memory array of claim 5, wherein the p-well comprises the same p-well of the periphery decoder circuit.

7. The memory array of claim 1, wherein the shorting path comprises an undoped gate electrode material.

8. The memory array of claim 7, wherein the resistance of the undoped gate electrode material is on the order of 10's of mega ohms.

9. The memory array of claim 1, further comprising an additional word line formed over the second insulating/dielectric layer orthogonal to the at least one bit line and parallel to the first and second word lines, wherein the additional word line is electrically connected to the shorting path.

10. The memory array of claim 9, further comprising an additional discharging circuit electrically connected to the additional word line and an additional discharge terminal.

* * * * *